(12) United States Patent
Poulsen

(10) Patent No.: US 7,365,598 B2
(45) Date of Patent: Apr. 29, 2008

(54) GLOBAL LOOP INTEGRATING MODULATOR

(75) Inventor: Søren Poulsen, Kongens Lyngby (DK)

(73) Assignee: Danmarks Tekniske Universitet, Kongens Lyngby (DK)

( * ) Notice: Subject to any disclaimer, the term of this patent is extended or adjusted under 35 U.S.C. 154(b) by 24 days.

(21) Appl. No.: 10/556,210

(22) PCT Filed: May 6, 2004

(86) PCT No.: PCT/DK2004/000317

§ 371 (c)(1),
(2), (4) Date: Nov. 9, 2005

(87) PCT Pub. No.: WO2004/100356

PCT Pub. Date: Nov. 18, 2004

(65) Prior Publication Data

US 2006/0261885 A1    Nov. 23, 2006

(30) Foreign Application Priority Data

May 9, 2003   (DK) ............................. 2003 00704

(51) Int. Cl.
*H03F 3/38* (2006.01)
(52) U.S. Cl. ...................................... 330/10
(58) Field of Classification Search .................. 330/10
See application file for complete search history.

(56) References Cited

U.S. PATENT DOCUMENTS

| | | | |
|---|---|---|---|
| 4,041,411 A | 8/1977 | Sturgeon | |
| 5,521,549 A | 5/1996 | Nelson | |
| 6,249,182 B1 | 6/2001 | Pullen | |
| 6,489,841 B2 | 12/2002 | Takagishi | |
| 6,552,606 B1 | 4/2003 | Veltman et al. | |
| 6,628,166 B2 * | 9/2003 | Delano | 330/251 |

FOREIGN PATENT DOCUMENTS

| | | |
|---|---|---|
| DE | 198 38 765 A1 | 11/2000 |
| WO | WO 98/19391 | 5/1998 |
| WO | WO 02/025357 A2 | 3/2002 |
| WO | WO 03/090343 A2 | 10/2003 |

* cited by examiner

*Primary Examiner*—Steven J. Mottola
(74) *Attorney, Agent, or Firm*—Cooper & Dunham LLP

(57) ABSTRACT

A switch-mode modulator operating at a two-level voltage and including an alternating output stage (3), an optional output filter (5) and a feedback including a function block (14) with a transfer function (MFB). The modulator furthermore includes a forward block (12) provided with means for calculating the difference between the signal (14a) originating from the function block (14) and a reference signal (REF) as well as with a transfer function (MFW). The output (13) of the forward block (12) is the input of a Schmitt-trigger (9), which generates switch on signals (2) for changing the output stage. The output voltage ($V_{OUT}$) of the modulator applying either after the optional output filter (5) or the output stage (3) is fed back through the function block (14) so as to generate the signal (14a) fed back. The transfer function of the function block (14) and of the forward block (12) is chosen both in response to the transfer function of the output filter (5) and in response to the desired total open-loop-transfer function of the modulator.

16 Claims, 17 Drawing Sheets

GLOBAL LOOP INTEGRATING MODULATOR

TECHNICAL FIELD

The invention relates to a switch-mode modulator as described in the preamble of claim 1.

BACKGROUND OF ART

Power amplifiers are well-known components used for amplifying electric signals at the signal level, viz. signals at a usually low voltage level. Such a low voltage level can for instance be ±2 volt, ±15 volt or 0 to 5 volt, i.e. the voltages at which ordinary electronic circuits operate. The power amplifier serves to amplify such a low voltage up to a considerably increased power potential. The latter power potential is obtained by intensifying the low voltage to an increased voltage, i.e. by upscaling the low voltage with the result that the signal level is separated from the power level.

Usually, the power amplifiers are classified in class A, class B, class AB, class C and class D amplifiers. A power amplifier classified in class A, class B, class AB or Class C is based on the linear, active area of a transistor. Therefore, the power amplifier can be considered an ideal, controlled voltage source connected in series to an internal resistance, the load of said power amplifier being connected in series to said internal resistance. Elementary circuit calculations show that a rather significant portion of the power supplied by the ideal voltage source is allocated to the internal resistance and thereby not to the load. In theory, it is possible to achieve a maximum efficiency, i.e. the relation between the power received and the power delivered by the power amplifier, of almost 80% by means of a class B amplifier, but in practice, the efficiency does not usually exceed 60%. The power loss is mainly allocated in the power amplifier in form of heat, and said heat must be carried away such as for instance by way of cooling. Usually, the voltage source is not ideal, and it depends on the desired power level, the extent and character of the load as well as on the frequencies involved.

When an input signal with a known frequency content is compared with the resulting output signal, and when said output signal is subjected to a frequency analysis, differences are inevitably found in the relation between the amplitudes of the individual frequencies and the frequencies found in the signal. In addition, these relations change in response to the load on the power amplifier. Therefore, it is possible to indicate a figure for the distortion of the power amplifier versus the frequency and the power, and this figure represents a quality figure for the power amplifier which can be used for determining the class of said power amplifier.

The power amplifiers of the classes A, B, AB and C have been constructed for many years, and the advantages and limitations thereof are well-known as well. However, the power amplifiers of the class D differ from the other power amplifiers by the output transistors thereof being used as switches or electronic switch elements. Most of the internal losses found in a linear amplifier are caused by the fact that the operating point of the transistors used is found in the linear area. This linear area shows a rather significant potential drop across the transistors while a rather significant current passes through said area. On the other hand, when the transistors are always "switched on", i.e. a low potential drop applies across the transistors while the current through said transistor differs from 0; or when said transistors are "switched off", i.e. the potential drop across said transistor is significant while the current through the transistor is very low, almost 0; then the resulting power loss in the transistors is always low. Furthermore, the only period involving a significant power loss is the period during which the transistor changes from being switched on to being switched off, i.e. when both the current and the voltage differ from zero. Now, when the transistor is switched on and off at a high speed, viz. at a high frequency, the resulting voltage is a square voltage. When the relation between the switched on and off periods of the transistors is varied, the continuous average value of the resulting voltage represents a predetermined value. The latter pre-determined value can be controlled in such a manner that it is possible to ensure that said value corresponds to the input signal to the power amplifier. Accordingly, it has now been rendered possible to structure a power amplifier presenting a significantly improved efficiency compared to the hitherto known linear amplifiers.

A power amplifier operating according to the above principle is often called a switch-mode power amplifier or a pulse width-modulated power amplifier. Such an amplifier implies that a control signal must be generated for the transistors in order to switch said transistors on and off in response to the input signal. The control signal is for instance generated by a comparison of the input signal with a triangular voltage, and when the triangular voltage presents a value lower than the input voltage, a control signal is generated for the transistors reading that said transistors must either be switched on or off. When the triangular voltage assumes a value higher than the value of the input signal, a second control signal is generated for the transistors, said second control signal presenting a value opposite the value of the preceding signal. The frequency of the triangular voltage is often called the change-over frequency or the switch-frequency. This switch-frequency depends inter alia on the intended use of the power amplifier. When it is a question of a class D amplifier used for playing for instance music, an advantage is found in using the frequency characteristics of the human ear as a starting point when the frequency is to be chosen. The maximum audible frequency for the human ear is usually approximately 20 kHz, and accordingly an advantage is found in choosing a switch-frequency which is considerably higher than said frequency, as an audible howl, a humming or hissing sound is otherwise found in the resulting sound reproduction. Therefore, the resulting output voltage is a box-shaped or pulse-shaped voltage where the width of the individual pulses varies in response to the input signal.

Optionally, the output voltage (scaled down) and the input voltage may be input to an integrator, which integrates the voltage difference between the two signals. The resulting voltage signal is a triangular waveform with a changing frequency. This signal is then fed to a comparator with hysteresis. The voltage from the comparator is a square waveform, where the pulse width is dependent on the input voltage. The advantage is that no additional dedicated circuitry is required for producing the triangular waveform as described in the previous section. The frequency of the waveform, however, is dependent on the input voltage and may become very low, when the input voltage is near or at maximum.

Usually, the switch-frequency used is considerably higher than the frequency maximum to the human ear, and accordingly this switch-frequency does not usually result in audible nuisances. However, the rapidly alternating current and voltage can easily cause a radio-frequency interference, and therefore it is often necessary to include a filter in order to avoid such an interference. Often a second order filter is used where an inductance is coupled in series to the output of the power amplifier and where a capacity is connected to the end of the inductance adjacent the output and to the frame reference. Therefore, the resulting output voltage complies rather well with the input signal.

However, the output filter involves complications. In particular, when the power amplifier is unloaded, the resonance frequency of the filter can be excited, and as a result of the poor attenuation of the filter, viz. a high Q-factor, a rather significant voltage rise can be applied to the output. Such a voltage rise is problematic as it can cause damages to the power amplifier. This problem has often been solved by slightly oversizing the components of the power amplifier and/or by providing the output of said power amplifier with a load resistor. This load resistor is permanently coupled between the positive and negative poles of the output with the result that it provides an attenuation of the resonance of the output filter. This load resistor must necessarily be of such a size that it is able to efficiently attenuate the resonance of the output filter without causing a too high additional loss in the power amplifier. The load resistor is usually a cost-intensive component, and accordingly an advantage is found in avoiding the use of such a load resistor. Usually, the power amplifier is not used in the unloaded state, and therefore the use of a load resistor in form of a loading impedance, such as an RC-element with a high resistance, minimizes the power loss.

As mentioned above it is necessary to use an output filter in order to make the input signal comply well with the resulting output signal. However, the output filter is not ideal, and the components of the filter may present non-linear properties depending on temperature, frequency, current etc. Therefore, the output filter causes often per se a distortion of the desired output signal.

It is possible to considerably reduce a number of the draw-backs associated with a conventional linear amplifier by using a class D amplifier, but such a class D amplifier does per se also involve problems raising the price of the power amplifier and causing undesirable characteristics, such as noise from the switch-frequency, distortions from the output filter, overvoltages etc.

DE-PS No. 198 38 765 discloses a power amplifier employing a hysteresis control for generating pulse width-demodulated voltages. The difference between the input voltage and the output voltage is integrated in this power amplifier, said difference being stepped down by a factor corresponding to the ratio of the maximum level of the input voltage to the maximum level of the output voltage. The difference between the scaled output signal and the input signal corresponds to the instantaneous amplitude error of the output signal with the result that the integration corresponds to the accumulated error on the output. The output signal of the integrator is triangular, and when the power amplifier is idle running, the slope of said triangle is of the same value for both the positive and the negative flanks. When the power amplifier is to be set, i.e. loaded, these flanks change in such a manner that the positive flank discloses a slope differing from the slope of the negative flank. However, the curve shape remains triangular with straight flanks. As the power amplifier is increasingly loaded, the switch-frequency decreases as well. As a result, for instance the input signal to the power amplifier is sinusoidal, and then the switch-frequency is at maximum at the zero-pass for the sine curve and significantly lower at the maximum and the minimum value, respectively, of said sine curve. When the power amplifier is loaded to its maximum, i.e. when the maximum value of the output voltage is almost identical with the internal DC-voltage of the power amplifier, then the switch-frequency becomes very low, almost zero. The triangular signal from the integrator is transferred to a comparator, typically a Schmitt-trigger, which converts the triangular signal into square pulses of a varying pulse width. These square pulses are the switching on signals and the switching off signals, respectively, for the transistors in the power amplifier. These switching on pulses are transferred to the output stage of the power amplifier, viz. to the transistors in the output, and therefore these pulses are upscaled by the relation between said pulse voltages and the internal DC-voltage of the power amplifier. The resulting voltage includes square pulses and is typically of a higher amplitude than the signal voltage. The square voltage is then transmitted to the output filter of the power amplifier, said output filter typically being a second order filter which is often referred to as a reconstruction filter. The voltage applying after the filter is the output voltage of the power amplifier. The voltage returned to the integrator is the voltage applying before the output filter. A modulator of this type is often referred to as an Astable Integrating Modulator or an AIM. Such a modulator is encumbered with the problem that the distortions of the output filter have not been taken into account. In addition, the operational amplifier used to construct the integrator has to be of high quality.

WO 02/25357 discloses a controlled oscillation modulator, also called a COM. The COM ensures that the open-loop-phase characteristics involve a phase shift of exactly 180° at the frequency where the open-loop-amplification is 0 dB. The latter is rendered possible by the feedback voltage from the output stage of the power amplifier being forwarded through function blocks causing a phase shift of 180° and/or through function blocks with time delays. The desired phase shift of 180° is obtained by including said phase shift in the function blocks, such as in form of a cascade coupling of poles, and/or by choosing a suitable time delay. When the feedback loop is subsequently closed, the modulator oscillates at the frequency where the amplification is 0 dB. When the input signal to the power amplifier is 0, the resulting signal is a substantially pure sine. When the input signal differs from 0, the oscillation is superimposed by the input signal. A comparator is subsequently used for generating the switching pulses of the output stage. An increasing loading of the amplifier has the effect that the pure sine resulting from the phase shift of 180° is altered into being something between the pure sine and the triangular voltage known from AIM. The linearity of a modulator depends on variations in the inclination of this signal. As this signal is not a pure triangular curve unlike AIM, but instead something between a sine curve and a triangular curve, the modulator according to the COM principle is nonlinear, and the modulation per se distorts the output signal.

WO 98/19391 describes a way of improving a power amplifier of the D class. The amplifier includes an internal modulator generating the well-known pulse-width-demodulated output signal. This signal is transmitted to an output filter, and the resulting filtered signal is the output voltage of the power amplifier. In order to compensate for the distortions of the filter, additional feedback loops have been included, and the characteristics of these feedback loops can compensate for the distortions of said output filter. The described system includes several cascade-coupled feedback loops for compensating the distortions. The system shows an improved procedure structure with respect to power amplifiers without such feedbacks, but the system is per se very complex and requires much design work in order to achieve the desired effect. A system of this type is often referred to as being Multivariable Enhanced Cascade Controlled or MECC.

U.S. Pat. No. 6,249,182 B1 discloses a modulator with an outer feedback loop after the output filter. The feedback has a lag-lead characteristic where the combination of the feedback, the output filter and the forward block creates a pole at zero, a double pole at the filter frequency and a zero followed by a pole in the feedback block.

U.S. Pat. No. 5,606,789 discloses a tracking converter comprising two Buck-converters. A discharge element ensures that the two converters are synchronized. The feedback is a current feedback, and the converter operates as a voltage controlled current generator.

U.S. Pat. No. 6,489,841 B2 discloses a switch made power amplifier, in which a resistor is placed in series with the capacitor of the output filter. This results in an output filter with two poles and a zero which reduces the suppression of noise. Furthermore, the power amplifier is AC-coupled and thus has poor amplification at low frequencies, Also, the poles f the output filter are far from the zero in the feedback and as a result, only one pole is achieved for the output filter.

U.S. Pat. No. 6,552,606 B1 discloses a modulator in which the feedback is the current measured through the capacitor of the output filter. The power amplifier is thus a voltage controlled current generator.

WO 03/090343 A2 discloses a power amplifier with a lead-lag feedback. The lead-lag in the feedback results in a second order response for the high frequencies.

DESCRIPTION OF THE INVENTION

Accordingly, the object of the invention is to provide a power amplifier of a simple structure, where the modulator per does not cause significant distortions, and where the distortions of the output filter have been taken into account and where the closed loop characteristics of the power amplifier are approximately a first order system. This object is obtained by means of the features described in the characterising clause of claim 1. As the output signal is the signal being fed back and not the output voltage of the output stage, the effect of the output filter on the output voltage has been compensated for. In addition, the resulting modulator is per se linear, i.e. the output voltage of the integrator block includes straight positive and negative flanks. In other words, the modulator does not per se distort the output signal. Furthermore, as the output voltage is fed back through the function blocks including the transfer function, and as the integration block can include transfer functions, it is rendered possible to completely or partially compensate for the zeros of the output filter. As described above, an output filter, such as for instance a second order filter, can be assumed with the result that rather significant voltage rises can apply to the output of the switch-mode power amplifier, which in turn can cause damages to either said switch-mode power amplifier or to the equipment coupled to said switch-mode power amplifier. As the output voltage after the output filter is fed back through the function blocks, it is possible to efficiently compensate for voltage rises on the output. Subsequently, it is not necessary to include an additional load impedance, such as for instance an RC-element or similar element, on the output of the switch-mode power amplifier for attenuating or removing these overvoltages. Therefore it is not necessary to include additional feedbacks in order to compensate for the effect of the output filter on the output voltage. Measurements on a switch-mode power amplifier according to the invention have demonstrated that said power amplifier possesses good properties with respect to distortion of the output signal both in relation to the output supplied and in relation to the output frequency.

BRIEF DESCRIPTION OF THE DRAWINGS

The invention is explained in greater detail below with reference to the accompanying drawings, in which FIGS. 9 to 14 are without output filters and FIGS. 15 to 20 are with output filters.

BEST MODE FOR CARRYING OUT THE INVENTION

In the following description the transistors are illustrated by means of a simple switch symbol, both because the various types of relevant transistors are usually illustrated by means of different symbols, and because the object is to provide a transistor functioning in a way similar to an ideal switch in connections with a switch-mode power amplifier. The structuring of a switch-mode power amplifier according to the invention requires, of course, the use of driving circuits for the individual transistors. For the sake of clarity, these driving circuits have not been illustrated, and furthermore they are well-known to a person skilled in the art. It is necessary to post-process a control signal generated by for instance a modulator, and such a post-processing can for instance be carried out by means of so-called dead time generators as well as other circuits necessary for driving the transistors in the output stage of the power amplifier. These circuits are also well-known to a person skilled in the art, and for the sake of clarity they are not illustrated.

Figure 1:
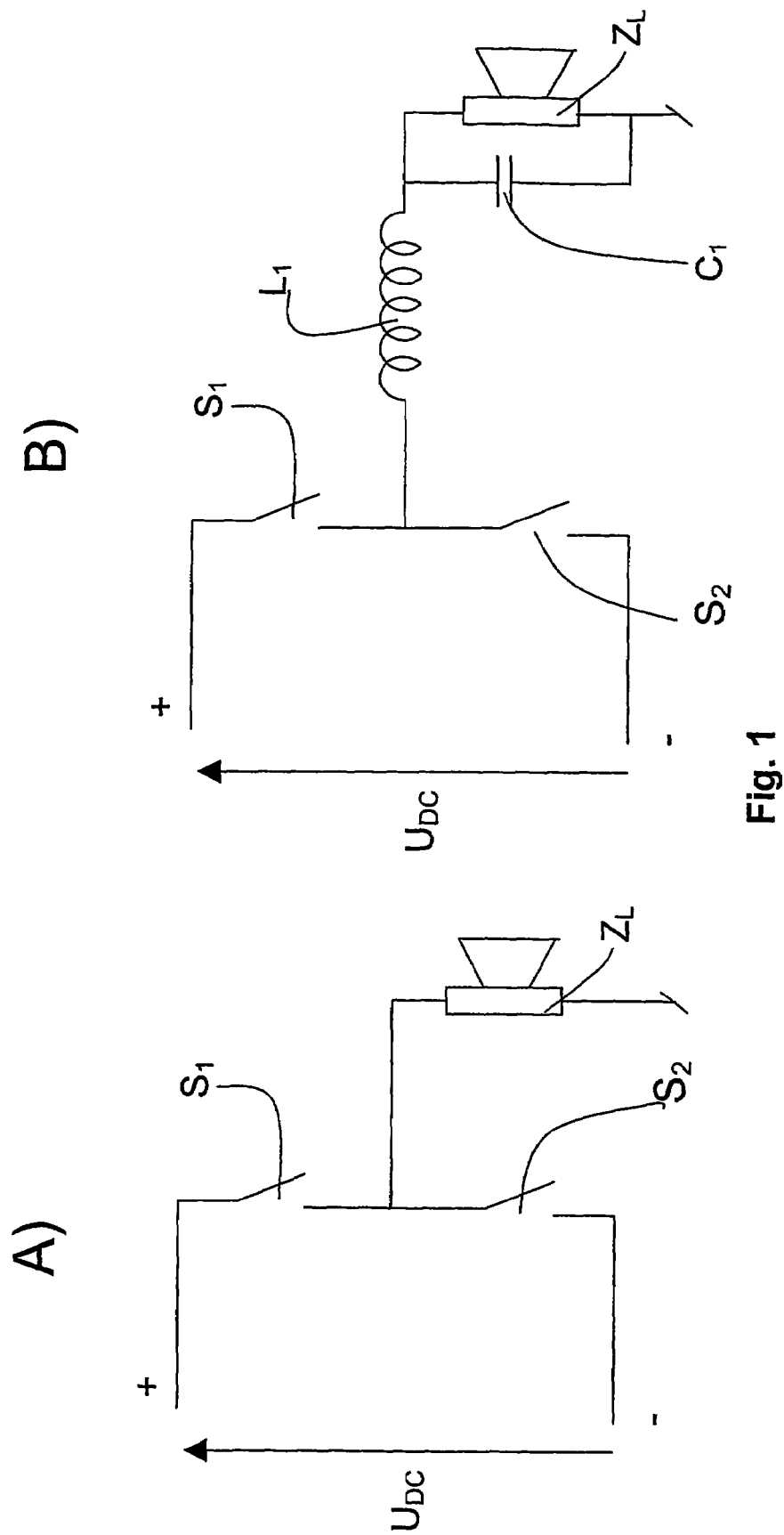
FIG. 1 shows the output stage of a switch-mode power amplifier as well as said output stage with a reconstruction filter included.

FIG. 1A shows the most simple form of a switch-mode power amplifier. A suitable double DC voltage $U_{DC}$ supplied by the power supply of a switch-mode power amplifier is fed to the illustrated output stage. The control signals for the electronic switch elements $S_1$, $S_2$ determine whether either the electronic switch element $S_1$ is closed or the electronic switch element $S_2$ is open with the result that the load $Z_1$ is coupled between the positive and negative pole of the supply voltage $U_{DC}$; or in the opposite case where the electronic switch element $S_1$ is open and the electronic switch element $S_2$ is closed, then the load $Z_1$ is short-circuited, i.e. no voltage is applied thereon. The switch elements $S_1$, $S_2$ are usually controlled by means of a single control signal, where said control signal has the effect that the electronic switch element $S_1$ is closed while the electronic switch element $S_2$ is opened and vice versa. The resulting voltage across the load $Z_1$ is therefore a square, pulse-shaped voltage. As mentioned above, a power amplifier does not usually cause audible nuisances due to the switch frequency, as said switch frequency is usually significantly increased above the audible area. However, the filter is necessary for limiting the radio-frequency interference. Therefore, it is ordinarily desirable to filter out the voltage originating from the output stage of the switch-mode power amplifier as shown in FIG. 1B. The circuit of FIG. 1B corresponds to the circuit of FIG. 1A apart from the fact that the capacity $C_1$ and the inductance L1 form a filter for the output voltage. A filter arranged in this manner is often referred to as a restructuring filter. Usually, a restructuring filter includes passive components, such as capacities, resistances and inductors, and such a filter smoothens the square pulse voltage from the output stage. In addition, such a filter may cause a distortion of the resulting output voltage of the switch-mode power amplifier.

Figure 2:
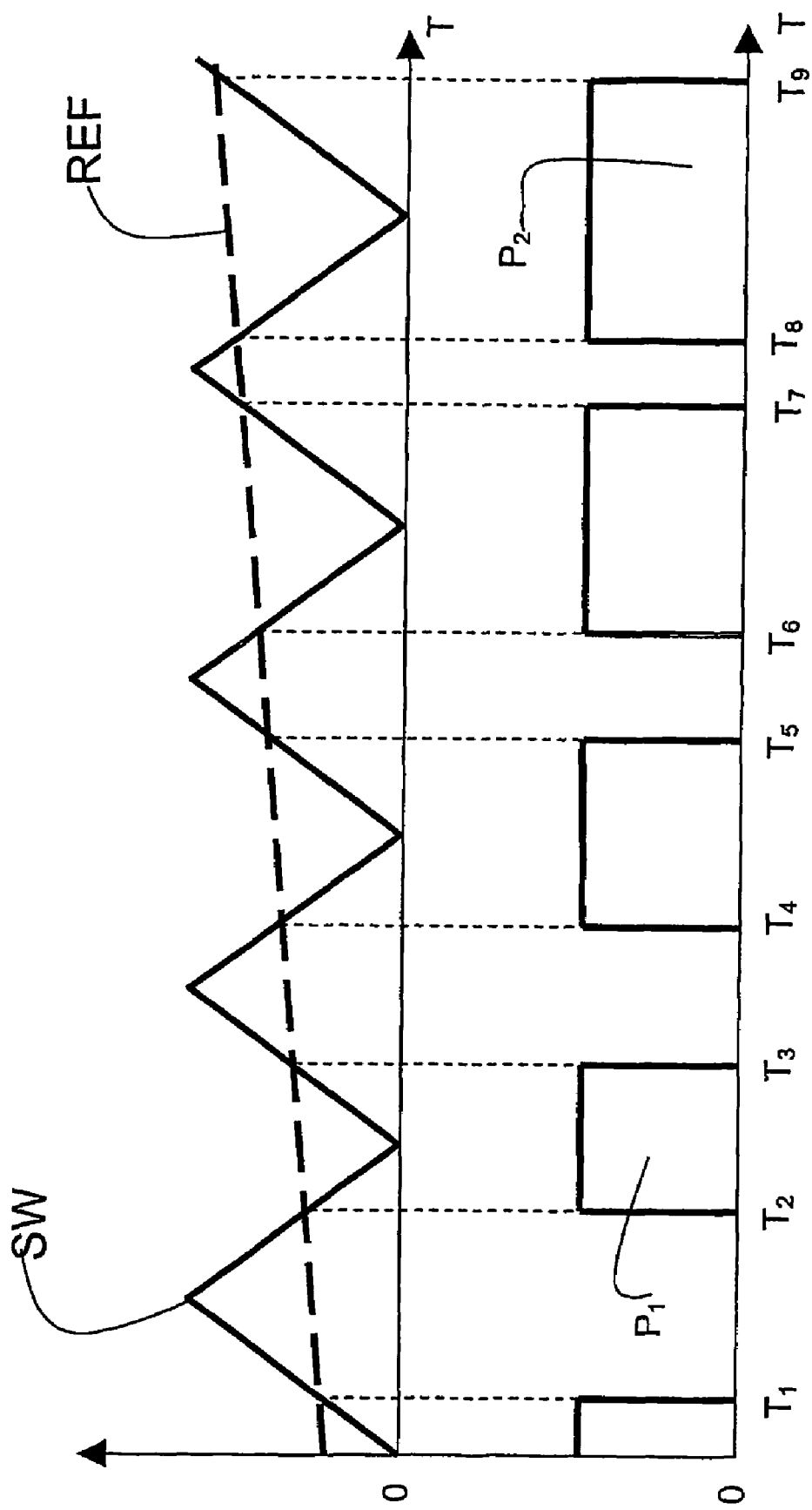
FIG. 2 shows a way of generating PWM-voltages.

FIG. 2 shows one way of generating the output voltages of a switch-mode power amplifier by means of a triangular voltage SW with identical, straight flanks, i.e. both positive and negative. The frequency of the triangular voltage SW is usually significantly higher than the maximum frequency to be amplified, typically 10 to 20 times higher or more, such as in the situation where the power amplifier is used for playing music where the frequency is usually 40 times higher. The latter triangular voltage is compared with a reference voltage REF, i.e. the input voltage for the switch-mode power amplifier. As long as the reference voltage exceeds the triangular voltage SW, the resulting output signal from the modulator is "high", i.e. a signal is generated which switches on the electronic switch element $S_1$ and switches off the electronic switch element $S_2$ shown in FIG. 1A. At the time $T_1$, the triangular voltage SW crosses the reference voltage with the result that the modulator generates a "low" signal, viz. a signal switching on the electronic switch element $S_2$ and switches off the electronic switch element $S_1$ shown in FIG. 1A. At the time $T_2$, the reference voltage REF crosses the triangular voltage SW again with the result that the modulator generates a high signal again. Such a procedure continues at all the times where the reference voltage REF crosses the triangular voltage SW, i.e. at the times $T_3$, $T_4$, $T_5$, $T_6$, $T_7$, $T_8$ and $T_9$. The reference signal REF shown in FIG. 2 is slowly increasing. When the length of the voltage pulse generated between the time $T_2$ and $T_3$, viz. the pulse $P_1$, is compared with the length of the pulse generated between the times $T_8$ and $T_9$, viz. the pulse $P_2$, it appears that the pulse length of $P_1$ is significantly shorter than the pulse length of $P_2$, which agrees with the reference signal REF between the times $T_2$ and $T_3$ being lower than between the times $T_8$ and $T_9$. The triangular signal SW is often referred to as the signal at a specific frequency, i.e. the switch frequency or the carrier frequency. The illustrated way of generating the switching on pulses for the electronic switch elements $S_1$, $S_2$ is only one way out of many possible ways. The triangular voltage can for instance be a sawtooth voltage. It is known to a person skilled in the art that the use of a sawtooth voltage instead of a triangular voltage ensures the same result, but it is necessary to frequently switch on and off the electronic switch elements. The above pulse-formed voltage is a two-level pulse-width-modulated voltage. Three-level pulse-width-modulated voltages are also known where the voltage alternates between a zero-voltage and the positive or the negative supply voltage, respectively. The three-level pulse-width-modulated voltages require the use of a means differing from the means shown in FIGS. 1A and 1B, but such a means is also well-known to a person skilled in the art.

Figure 3:
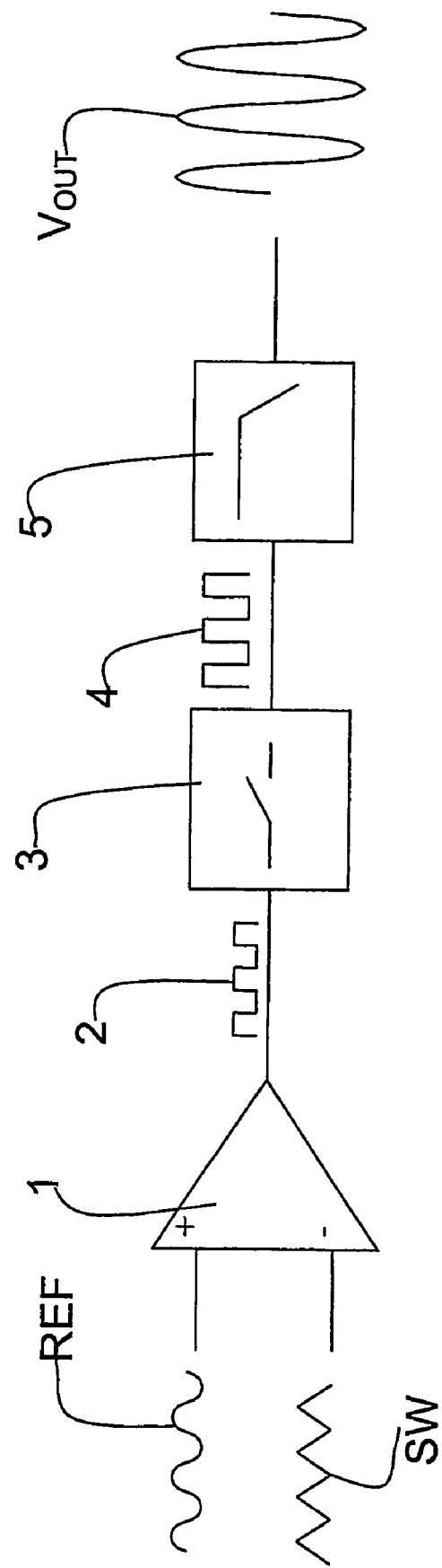
FIG. 3 is a diagram of the operation of a switch-mode power amplifier.

FIG. 3 shows a flow chart for a switch-mode power amplifier. The reference signal REF is compared with the triangular voltage SW by means of a comparator 1. The function of the comparator 1 corresponds to the way the switching on signals are generated as shown in FIG. 2. The switching of signals 2 are transferred to the output stage 3 of the switch-mode power amplifier, and the resulting square voltage 4 presents usually a higher amplitude than the switching on signals 2. These switching on signals 2 are transmitted to an output filter 5 with the result that the desired output voltage $V_{OUT}$ is subsequently generated. Therefore, the function of the illustrated flow chart is substantially the same as the function illustrated in FIGS. 1 and 2. The illustrated reference signal REF is shown with a frequency almost corresponding to the triangular voltage SW, but as mentioned above the frequency of the triangular voltage SW is usually significantly higher than the maximum frequency of the reference signal to be amplified, i.e. usually at least 10 to 20 times higher. The frequency of the triangular voltage is usually kept substantially constant and is generated on the basis of the oscillations of for instance a crystal or by means of an a stable multivibrator. An stable multivibrator is most preferred because usually a very accurate switch frequency is not necessary. The frequency of the triangular voltage SW is therefore well-known and always the same.

Figure 4:
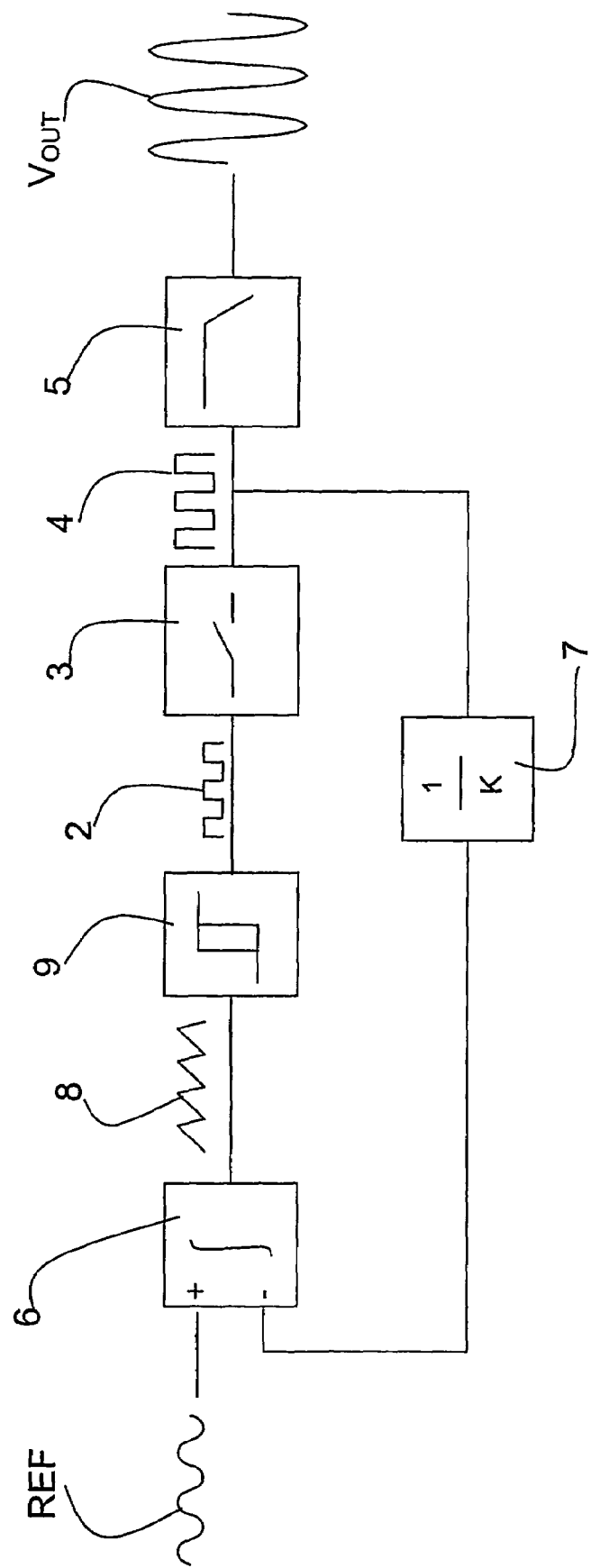
FIG. 4 shows a switch-mode power amplifier operating according to the AIM principle.

FIG. 4 shows a switch-mode power amplifier operating according to the Astable Integrating Modulator principle described in the DE-PS No. DE 198 38 765. This principle is also referred to as AIM. As illustrated in FIG. 4, a switch-mode power amplifier operating according to the AIM-principle generates switching on pulses 2 which are transferred to the output stage 3 of a switch-mode power amplifier. These pulses 2 generate square voltage pulses 4 which are transmitted to an output filter 5 reconstructing the desired output signal $V_{OUT}$. The latter corresponds to the general principle illustrated in FIG. 3. However, the way of generating the switching of signals 2 differs from the way shown in FIG. 3. The generated square voltage 4 is transferred to a scaling block which scales the amplitude of the square voltage 4 by a factor K. This factor K can for instance be the relationship between the maximum amplitude of the reference voltage REF and the maximum amplitude of the square voltage 4. The difference between the reference signal REF and the downscaled square voltage 4, viz. the error signal, is integrated in an integration block 6. The resulting triangular voltage 8 presents numeric, straight flanks when the switch frequency is high compared to the input frequency, but the slope of the positive flank differs from the slope of the negative flank. The triangular voltage 8 is transferred to a Schmitt-trigger, i.e. a comparator with a built-in hysteresis. The output voltage resulting from the Schmitt-trigger is in form of the square switching on signals 2 for the output stage 3 of the switch-mode power amplifier. As a feedback exists from the square voltage 4, it is therefore possible to ensure that the resulting output voltage $V_{OUT}$ presents an improved agreement with the reference signal, i.e. the form of the output signal is substantially similar to the reference signal. In addition, the distortion of the output signal has been reduced.

Figure 5:
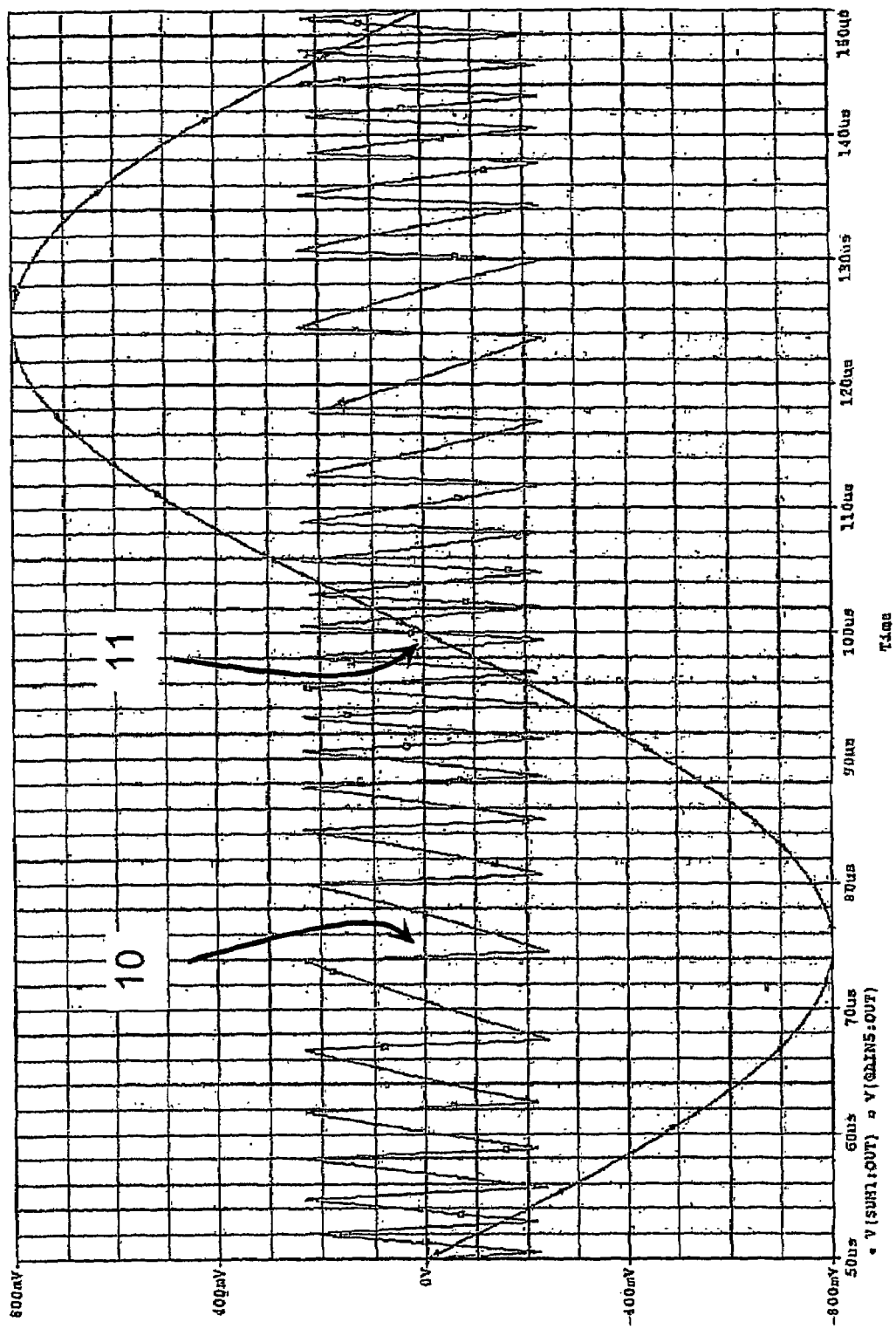
FIG. 5 shows the resulting modulation voltage of the switch-mode power amplifier shown in FIG. 4, FIGS. 6, 7 and 8 show various embodiments of a modulator according to the invention as well as additional feedback loops.

FIG. 5 shows both a sinusoidal reference signal REF and a triangular voltage signal corresponding to the triangular voltage signal 8 of FIG. 4. As illustrated, the frequency of the triangular voltage 8 is not constant, but depends on the loading of the switch-mode power amplifier, i.e. whether the resulting output voltage is high or approximately 0. It appears from the 0-crossing 11 of the sinusoidal reference voltage REF that the frequency is high whereas said frequency is significantly lower at the maximum and minimum value 10, respectively, of the sine curve. The latter is inter alia a consequence of the fact that a switch-mode power amplifier of this type does not employ for instance a crystal for maintaining a specific frequency as described in connection with FIG. 3. Under specific circumstances and/or as a consequence of an unfortunate design, the resulting drop in frequency can be so significant that it affects the audible quality of the output signal.

Figure 6:
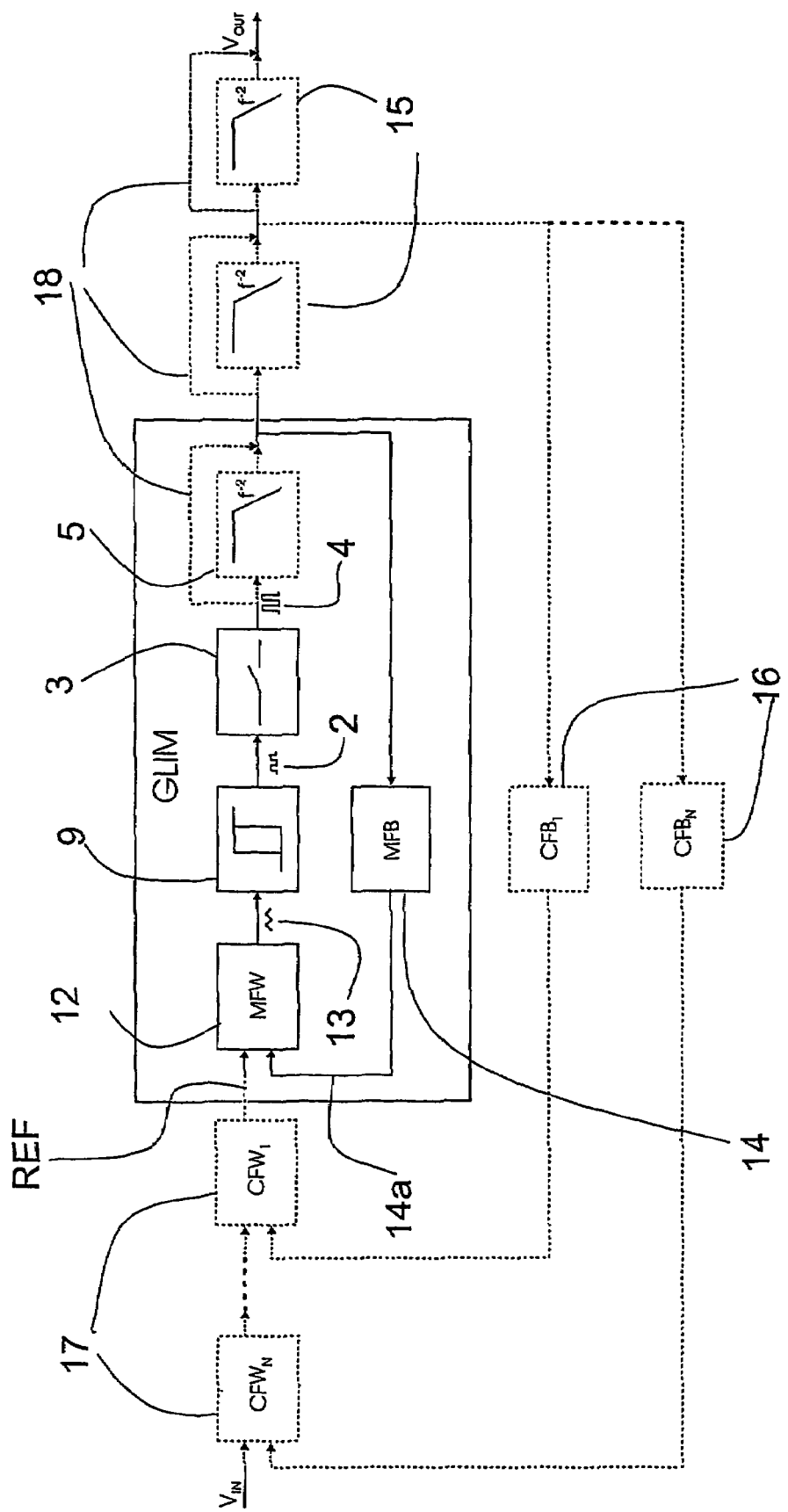

FIG. 6 shows a switch-mode power amplifier according to the invention. Like the previous examples, this power amplifier employs a switch on signal 2 for the output stage 3 of the power amplifier, said switch on signal generating a square voltage 4 being transmitted to an optional output filter 5 which reconstructs the desired output signal $V_{OUT}$. Unlike the AIM described in connection with FIG. 4, the output signal $V_{OUT}$ and not the square voltage 4 is fed back after the output stage 3 of the switch-mode power amplifier. The square voltage 4 or the voltage after the optional filter 5 is fed to a block 14 including the transfer function MFB for the feedback of the modulator. After the block 14, the signal is transmitted to a block 12 including the transfer function MFW for the forward of the modulator as well as the extraction of the difference between the reference signal and the signal fed back. However, the output signal 13 of the block 12 is instead a triangular signal with numeric, equally steep flanks, and the positive and the negative flanks present differing slopes. This signal 13 is transferred to a block 9 including a Schmitt-trigger, and the output signal 2 of the block 9 is the switch on signal 2 for the output stage of the switch-mode power amplifier. As a result of structuring the switch-mode power amplifier according to this principle it is allowed to take into account the distortions of the output filter 5 and the output filter per se. In addition, it is possible to ensure that the modulator does not per se cause a substantial distortion of the output signal $V_{OUT}$ due to the straight flanks of the signal 13.

Figure 7:
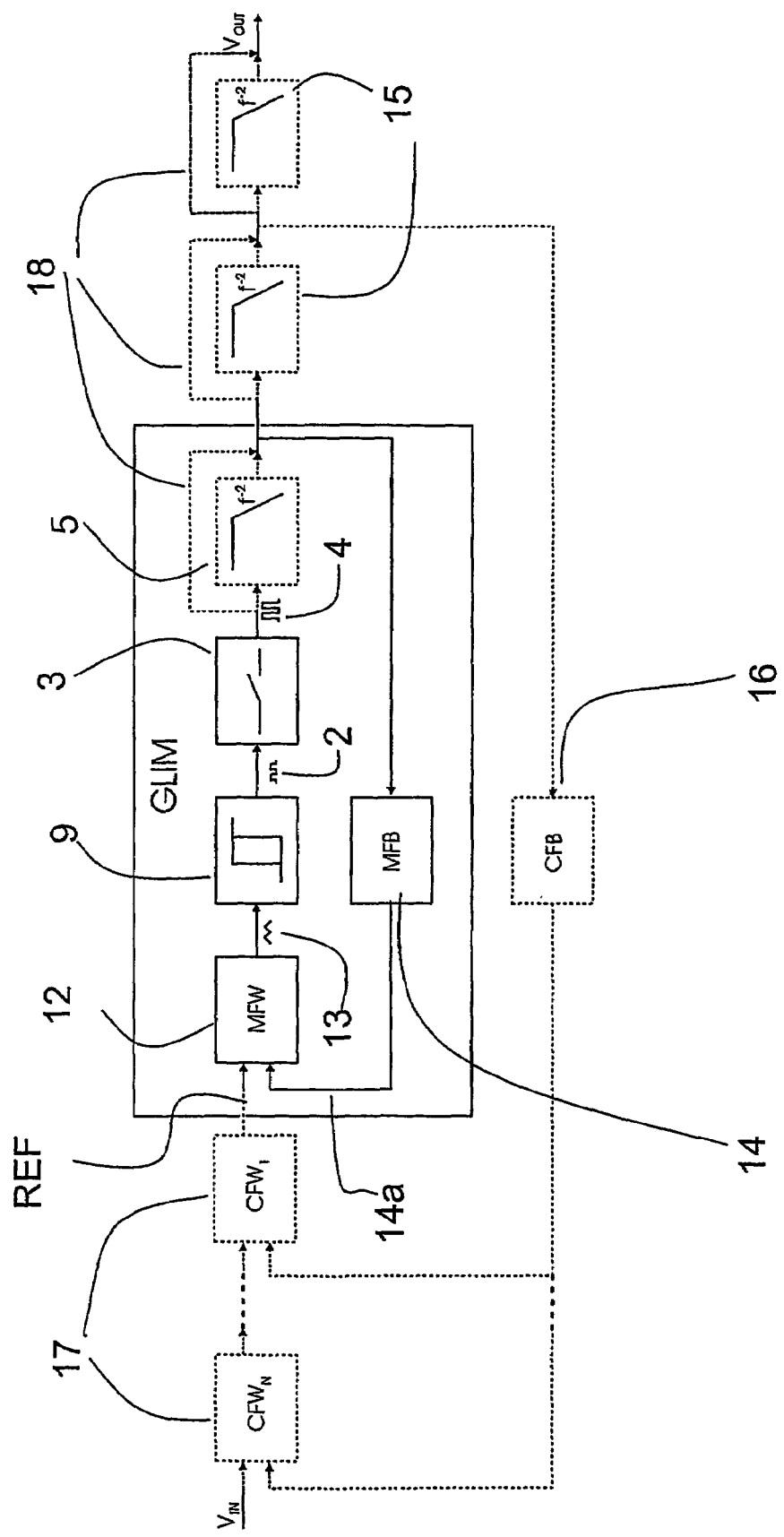
Figure 8:
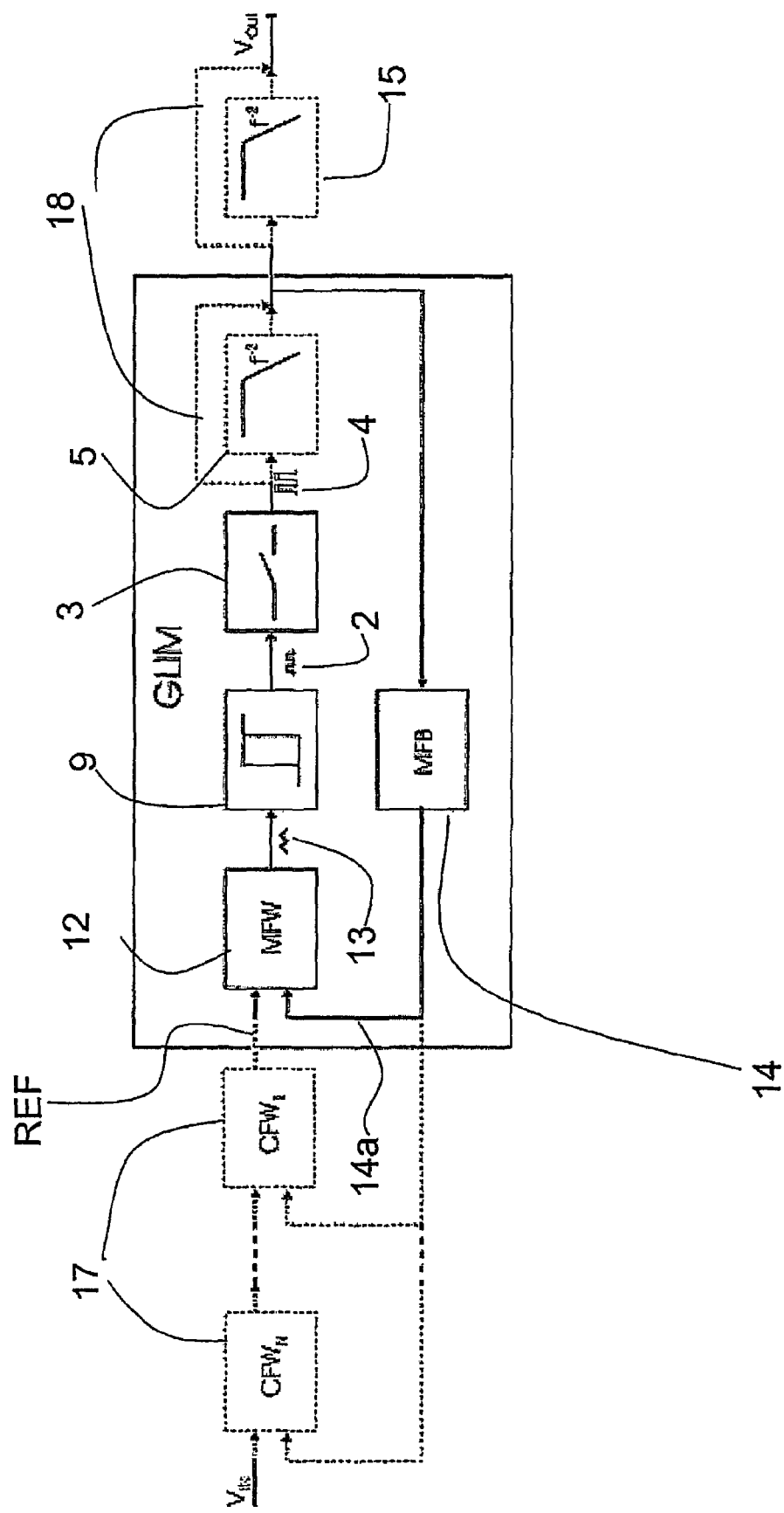

FIG. 6 additionally shows a plurality of optional components indicated by means of a dotted line. These optional components can for instance be additional output filters 15, one or more additional feedbacks 16 with their respective transfer functions $CFB_{1-N}$ and one or more forward blocks 17 with their respective transfer functions $CFW_{1-N}$. As indicated by means of the dotted line 18, the output filters 5, 15 can for instance be connected and disconnected to the system and thereby "short-circuit" said system. FIGS. 7 and 8 show variations of the embodiment shown in FIG. 6, where the embodiment of FIG. 7 only includes one additional block 16 in the feedback, and where the forward blocks 17 of the embodiment of FIG. 8 use the same feedback 14 as the modulator according to the invention. The modulator according to the invention will in the following be referred to as a GLIM-type modulator (Global loop integrating modulator).

Therefore, the amplifier or power supply according to the invention achieves the advantages through the structure of the modulator. Therefore, the open-loop-characteristics of a modulator according to the GLIM-principle are an approximation to an integration, i.e. a pole in zero.

Modulators according to the GLIM-principle can be divided up into two main families:
1. one type of modulators operating around the output stage only, and
2. one type of modulators operating around the output stage and the output filter.

A characteristic frequency can be used for both types of modulators. As far as type 1 and type 2 modulators are concerned, the frequency differing from zero forms part of a pole or zero in one or more of the blocks of the modulators. As far as type 2 modulators are concerned, the characteristic frequency is often chosen so that it coincides with the filter frequency of the output filter used. As far as type 2 modulators are concerned, the characteristic frequency is then the same as the power bandwidth.

Each of the two main families can be subdivided into two sub-families:
1. modulators including a single loop, i.e. a pure modulator, and
2. modulators including several loops (a modulator and a feedback loop or loops).

In addition, the realization of GLIM including a modulator loop with or without output filter and combined with one or more feedback loops with or without further output filters can be divided up into two sub-families:
1. modulator loops with pure first order low-pass characteristics at frequencies higher than the characteristic frequency, and
2. modulator loops with partial first order low-pass characteristics at frequencies higher than the characteristic frequency, such as layer-lead-characteristics with pole frequency in the characteristic frequency.

When the modulator loop does not present pure first order characteristics, an associated feedback circuit must ideally be formed so that the modulator and the feedback together present the desired first order low-pass characteristics. However, in practice, GLIM can be constructed so as to include a deviation therefrom as GLIM per se includes the modulator and only indicates guidelines for possible additional feedback circuits.

| Type 1 U/Output filter | | | Type 2 M/Output filter | | |
|---|---|---|---|---|---|
| Type 1.1 Pure modulator (AIM) | Type 1.2 Combined modulator and feedback | | Type 2.1 Pure modulator | Type 2.2 Combined modulator and feedback | |
| | Type 1.2.1 Modulator with first order low-pass characteristics | Type 1.2.2 Modulator deviating from first order low-pass characteristics | | Type 2.2.1 Modulator with first order low-pass characteristics | Type 2.2.2 Modulator deviating from first order low-pass characteristics |

Basic Properties of the Types
  Type 1) Modulator operating around output stage
  Ideally, the feedback and the forward block must together form a first order low-pass-characteristic at frequencies higher than the desired bandwidth.
  Type 2) Modulator operating around the output stage and the output filter.
  Ideally, the output filter, the feedback and the forward block must together form a first order low-pass-characteristic at frequencies higher than the desired bandwidth. In other words, when a second order output filter is used, such as for instance an LC filter, the feedback and the forward block must ideally together form a zero at frequencies higher than the filter frequency.

Basic Requirements Presented to the Sub-Families
  Type 1)
  Type 1.1
    Ideally, the feedback and the forward block must together present an open-loop-characteristics as a pure integration, i.e. a pole in zero.
    The modulator is an independent modulator not requiring further adjustment of the linear function.
  Type 1.2
    Ideally, the total open-loop-characteristics for the modulator and the feedback loop must be a pure integration, i.e. a pole in zero.
    Ideally, the open-loop-characteristics of the feedback loop must be the difference between the desired pure integration and the open-loop-characteristics of the modulator.
    Type 1.2.1
      Ideally, the modulator presents a pure first order open-loop-low-pass-characteristic at frequencies above the filter frequency, i.e. when the open-loop-characteristics of the modulator is a constant amplification by means of a pole, then the feedback loop(s) must ideally present an open-loop-characteristic as a pole in zero as well as a zero in the pole frequency of the modulator.
    Type 1.2.2
      The modulator deviates from presenting a pure first order open-loop-low-pass characteristic at frequencies above the filter frequency. The modulator can for instance present a lag-lead characteristic, which then ideally requires an open-loop-characteristic for the feedback loop(s) in form of a pole in zero, a zero in the pole frequency of the modulator as well as a pole in the zero frequency of the modulator.
  Type 2)
  Type 2.1
    Ideally, the output filter, the feedback and the forward block must together present an open-loop-characteristic as a pure integration, i.e. a pole in zero.
    The modulator is an independent modulator not requiring further adjustment of the linear function.
  Type 2.2
  Ideally, the total open-loop-characteristics for the output filter, the modulator and the feedback loop must be a pure integration, i.e. a pole in zero.
  Ideally, the open-loop-characteristics of the feedback loop must be the difference between the desired pure integration and the open-loop-characteristics of the modulator.
    Type 2.2.1
      Ideally, the modulator presents a pure first order open-loop-low-pass-characteristic at frequencies above the filter frequency, i.e. when the open-loop-characteristics of the modulator is a constant amplification by means of a pole, then the feedback loop(s) must ideally present an open-loop-characteristic as a pole in zero as well as a zero in the pole frequency of the modulator.
    Type 2.2.2
      The modulator deviates from presenting a pure first order open-loop-low-pass characteristic at frequencies above the filter frequency. The modulator can for instance present a layer-lead characteristic, which then ideally requires an open-loop-characteristic for the feedback loop(s) in form of a pole in zero, a zero in the pole frequency of the modulator as well as a pole in the zero frequency of the modulator.

The open-loop-transfer function of a modulator according to the GLIM-principle depends inter alia on the modulator-feedback MFB chosen for the block 14, and on the transfer function MFW chosen for the forward block 12.

Figure 9:
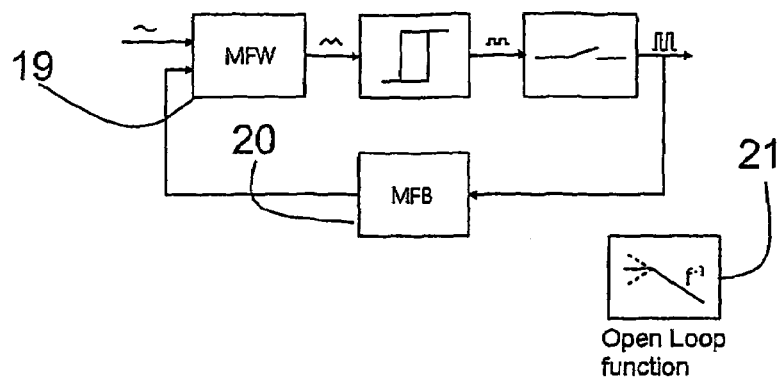
FIGS. 9 to 20 show various embodiments of a modulator according to the invention as well as the resulting open-loop-function, and where

FIG. 9 shows how the transfer functions MFB, MFW are chosen in general in the feed-back block 20 and the forward block 19, which results in differing open-loop-functions 21.

FIGS. 10, 11, 12, 13 and 14 show five possible examples of resulting open-loop-functions for GLIM-modulators of the first main family. However, the examples shown are not to be considered limited to these examples as several other possibilities exist.

Figure 10:
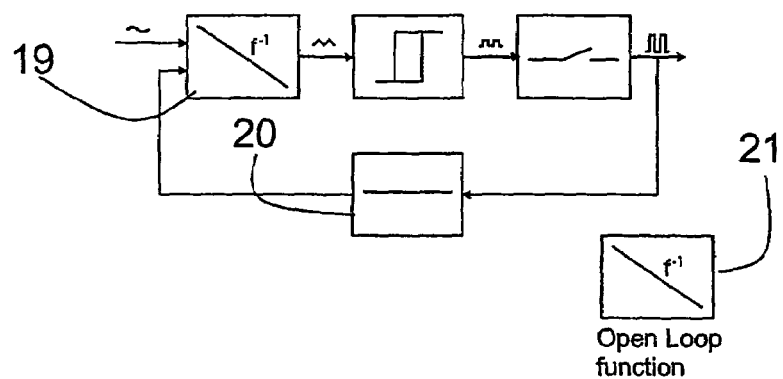
Figure 11:
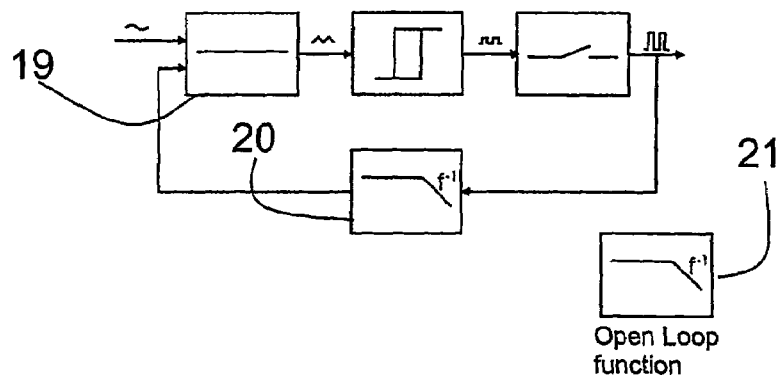
Figure 12:
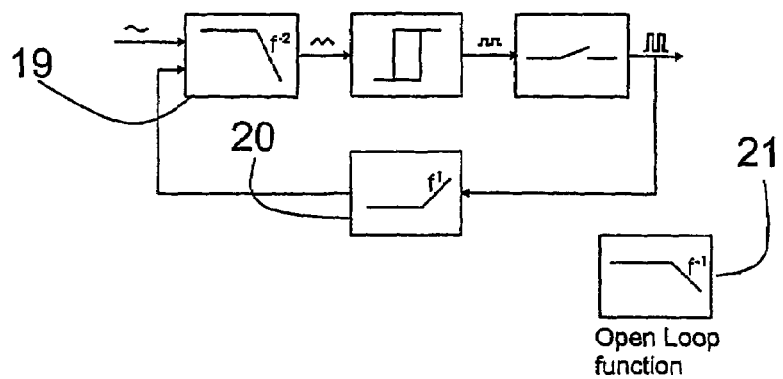
Figure 13:
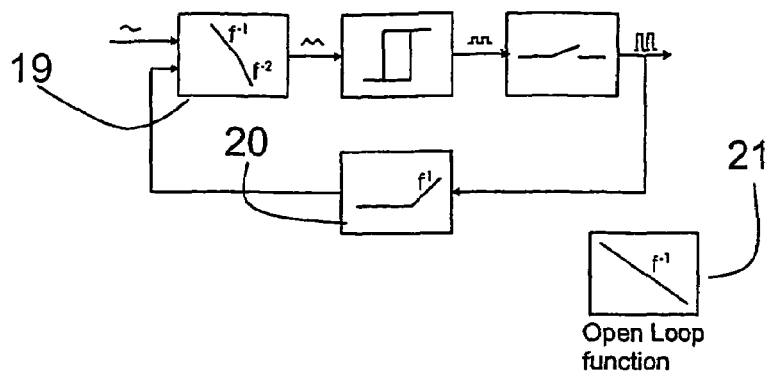
Figure 14:
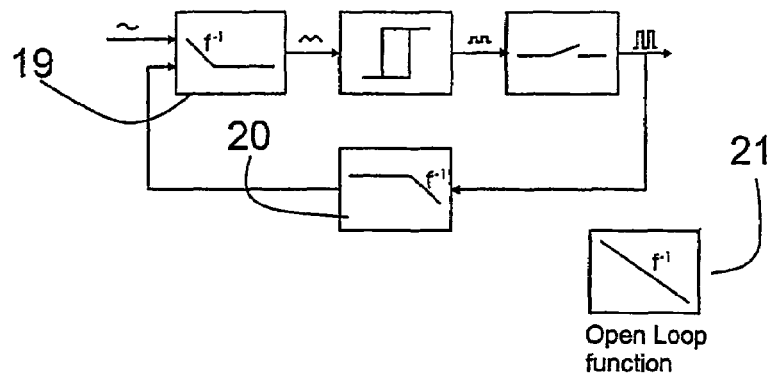

FIG. 10 shows a specific embodiment corresponding to AIM.

Figure 15:
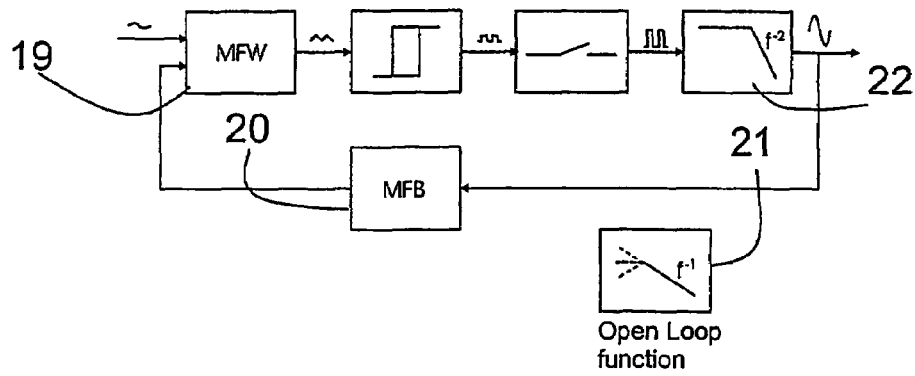
Figure 16:
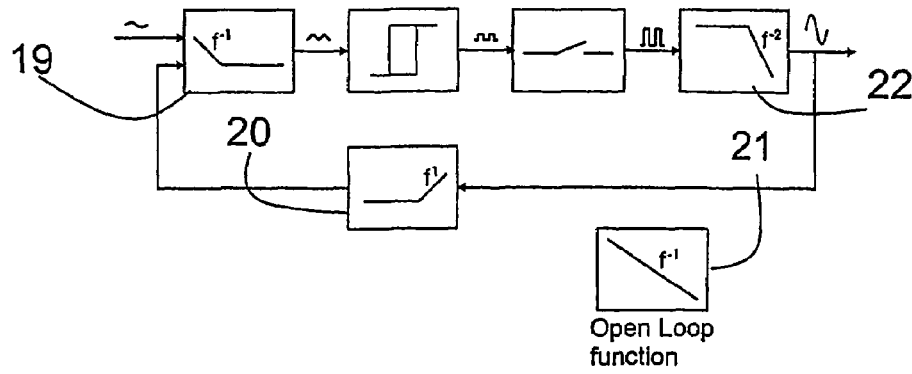
Figure 17:
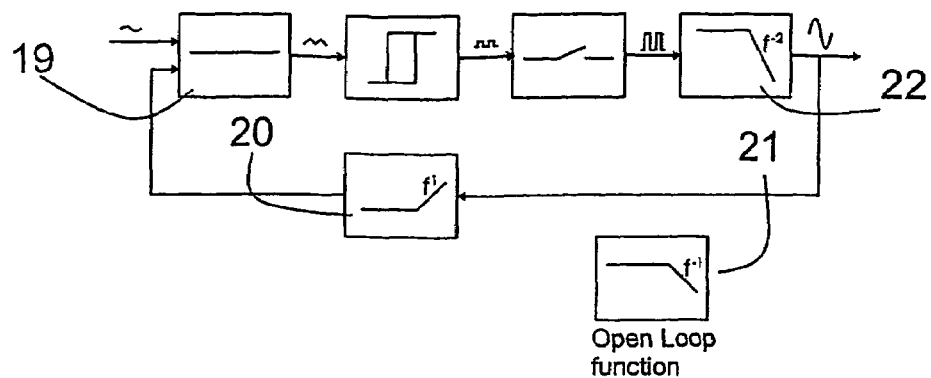
Figure 18:
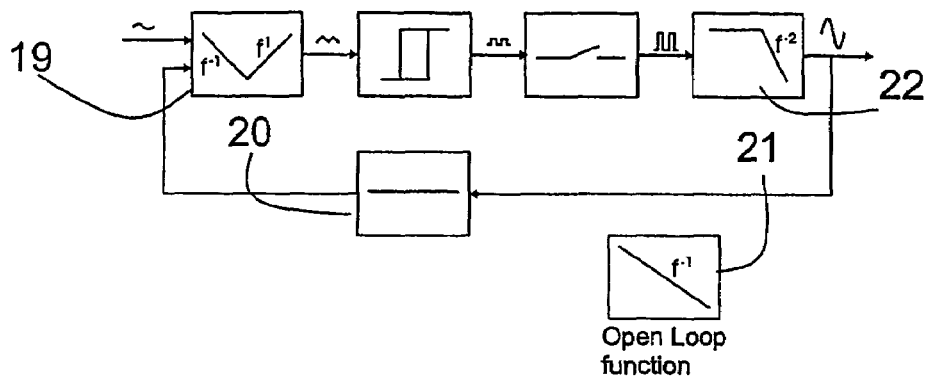
Figure 19:
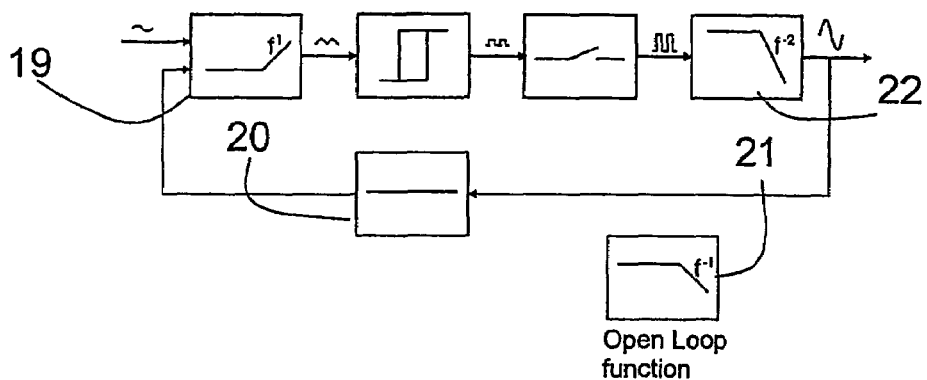
Figure 20:
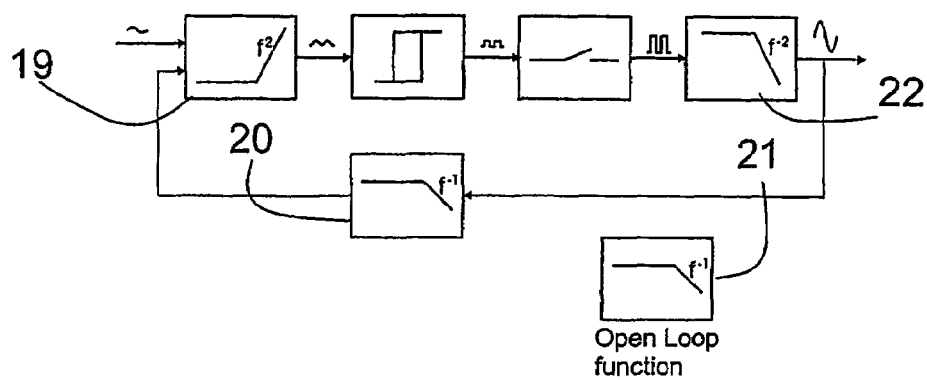

FIG. 15 shows a GLIM-modulator of the second main family, i.e. a modulator operating both as output stage and as output filter 22.

FIGS. 16, 17, 18, 19 and 20 show various possible transfer functions for the blocks 19 and 20 and the resulting open-loop-function 21. It should be noted, that the illustrated examples are nothing but a few examples out of many possible examples.

Figure 21:
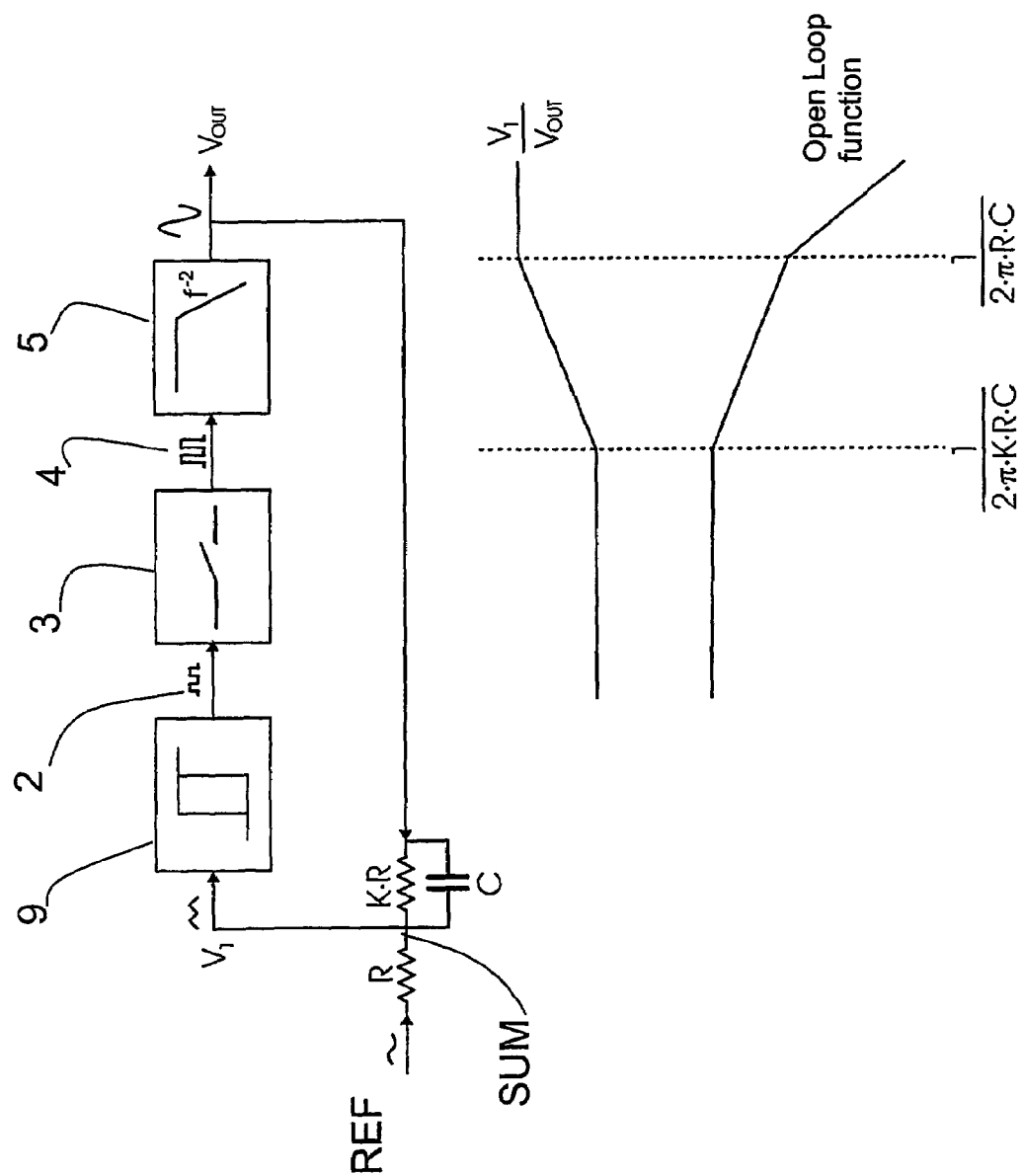
FIG. 21 shows an embodiment of the modulator according to the invention.

FIG. 21 shows a particularly simple way of structuring a modulator according to the GLIM-principle. In this embodiment, the output voltage $V_{OUT}$ is fed back to a first impedance, such as a parallel connection of a resistance K×R and a capacitor C. The reference signal REF is applied a summation point (SUM) through a second impedance, such as a resistance R, and after the summation point (SUM) the voltage $V_1$ is transferred to the Schmitt-trigger 9. As illustrated in the example, such a procedure provides two bends in the transfer function for the open-loop-function, i.e. at a frequency determined by K×R and a frequency determined by R. As shown, the components of the feedback circuit ensures both the desired zero in the filter frequency, but also a pole at the frequency K× of the filter frequency, where K is the LF-amplification of the modulator. However, it is easy to compensate for such a deviation by allowing the output of the feedback circuit to have a zero at this frequency. Such a technique is described below. An advantage of the two types of modulators 1.2.x and 2.2.x is that the modulator per se can be formed by means of passive components, which in turn is both simple and ensures the advantage that no active weak signal components must include the sawtooth carrier wave signal. As a result, the HF-performance requirement presented to the active weak signal components has been considerably reduced. As a result, it is possible to use inexpensive types of components for this purpose, and the performance of the weak signal components in the frequency area in question for the power supply/the amplifier is not significantly reduced as a consequence of a non-linear function caused by an HF-content in the signal to be processed by said components.

By optionally using several feedback loops, the total suppression of errors originating from the output stage as well as from the output filter can be increased significantly, viz. by a function as pole in zero and a zero in the filter frequency resulting in an amplification of zero-dB at high frequencies.

As mentioned above, a modulator according to the GLIM-principle can be constructed so that the open-loop-characteristics of the modulator loop per se deviates from being an approximated pure integration. Ideally, the requirement presented to the associated feedback system is that the open-loop-characteristics thereof are the difference between the pure integration and the open-loop-characteristics of the modulator.

Figure 22:
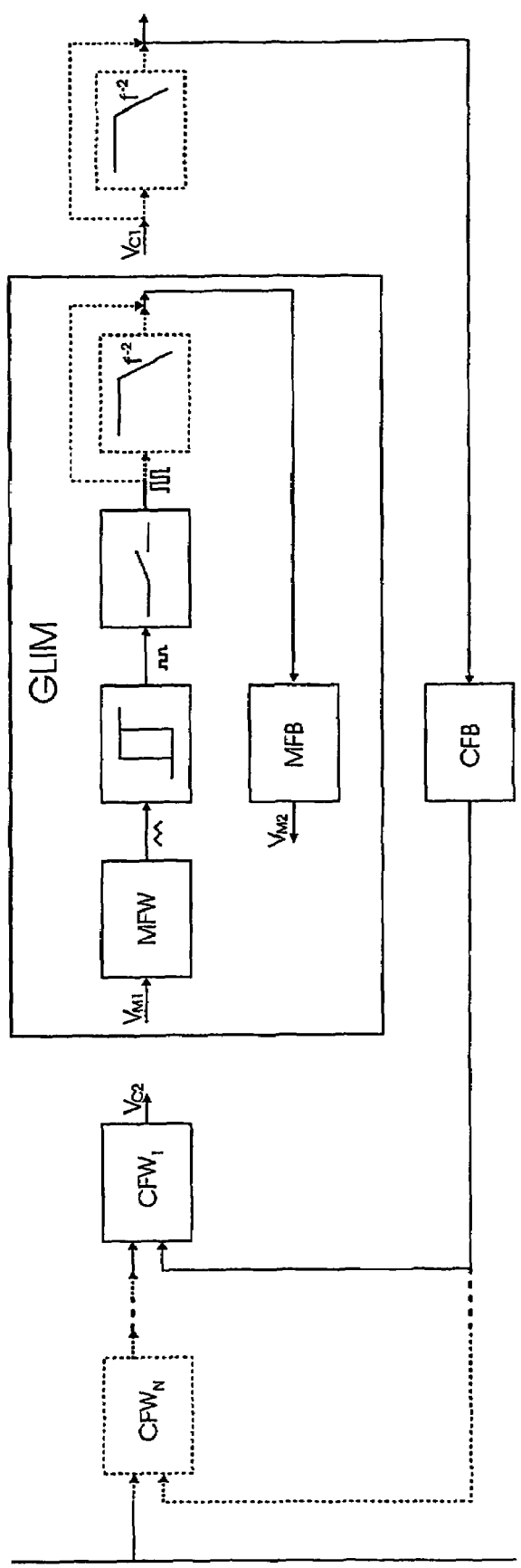
FIG. 22 shows the definition for the open-loop-function.

FIG. 22 shows the definition used for the interrupting locations of the open-loop-characteristics for the modulator and the feedback circuit. Accordingly, the open-loop-characteristics of the modulator is $L_{modulator}=W_{M2}/W_{M1}$ and correspondingly for the feedback circuit by means of one or more feedback loops $L_{control}=W_{C2}/W_{C1}$. Please note the definition in the figure of $W_{M1}$, $W_{M2}$, $W_{C1}$, $W_{C2}$, defining where the loop is opened corresponding to FIG. 7.

Figure 23:
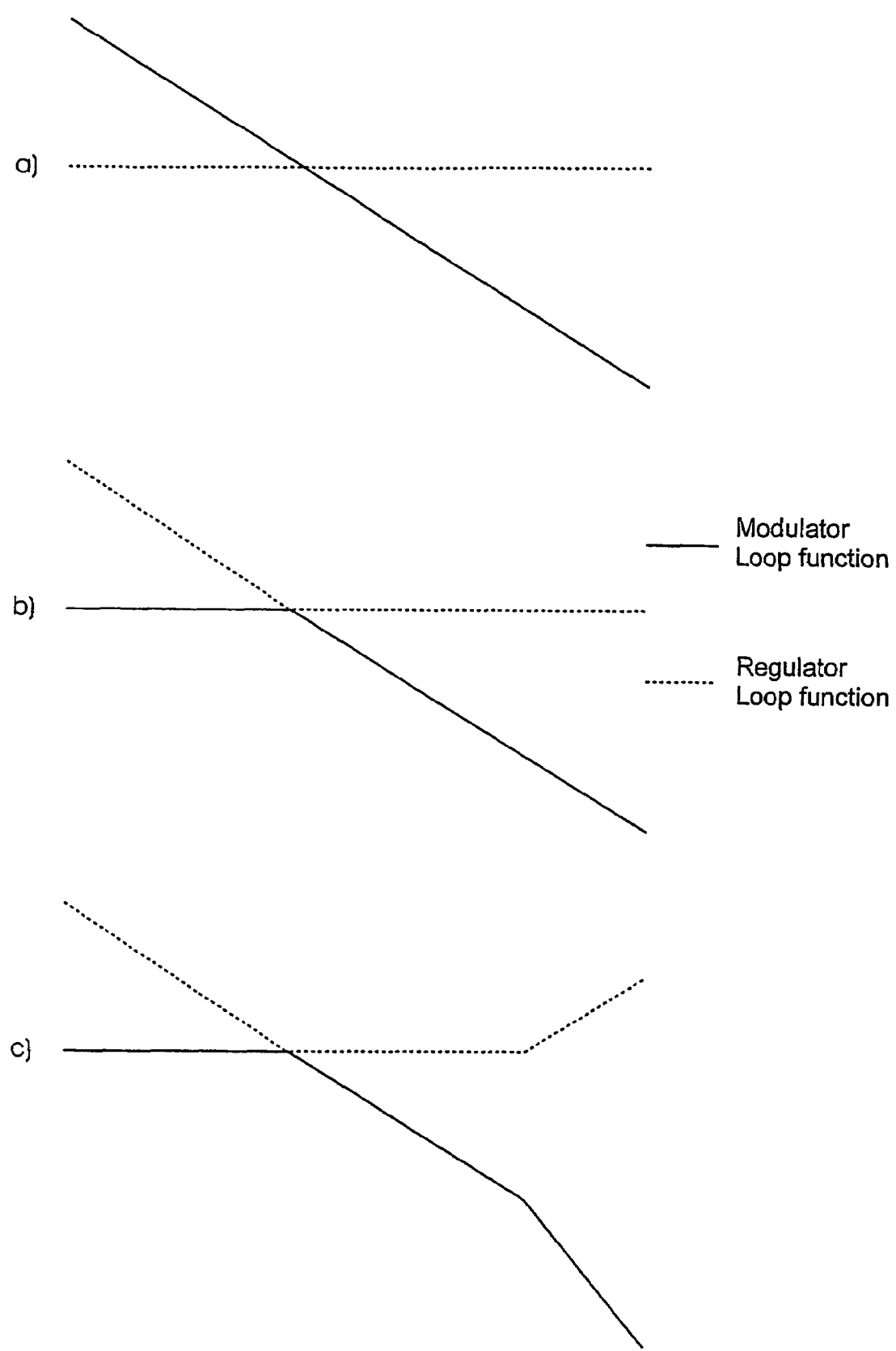
FIG. 23 shows the interaction between the open-loop-function of the modulator and the open-loop-function of the feedback.

FIG. 23 shows three examples of open-loop-functions for the modulator and the associated ideal feedback loops. The open-loop-function of the modulator is indicated by means of a solid line, and the transfer function of the feedback is indicated by means of a dotted line. The example A shows a modulator of type 1.1 or type 1.2. It appears that the requirement to the feedback system is in fact a constant amplification which is due to the fact that the modulator can operate alone because inherently it possesses the desired transfer function. Example B and C are examples of open-loop-functions where the modulator is of the type X.1.2 and the type X.2.2, respectively. It appears from Example B that the open-loop of the modulator presents a bend at a predetermined frequency, and accordingly the feedback loop has also a bend in the opposite direction at the same frequency. In example C the modulator presents two bends at different frequencies, and therefore the open-loop-transfer function of the feedback must also have two corresponding bends in the opposite direction.

Figure 24:
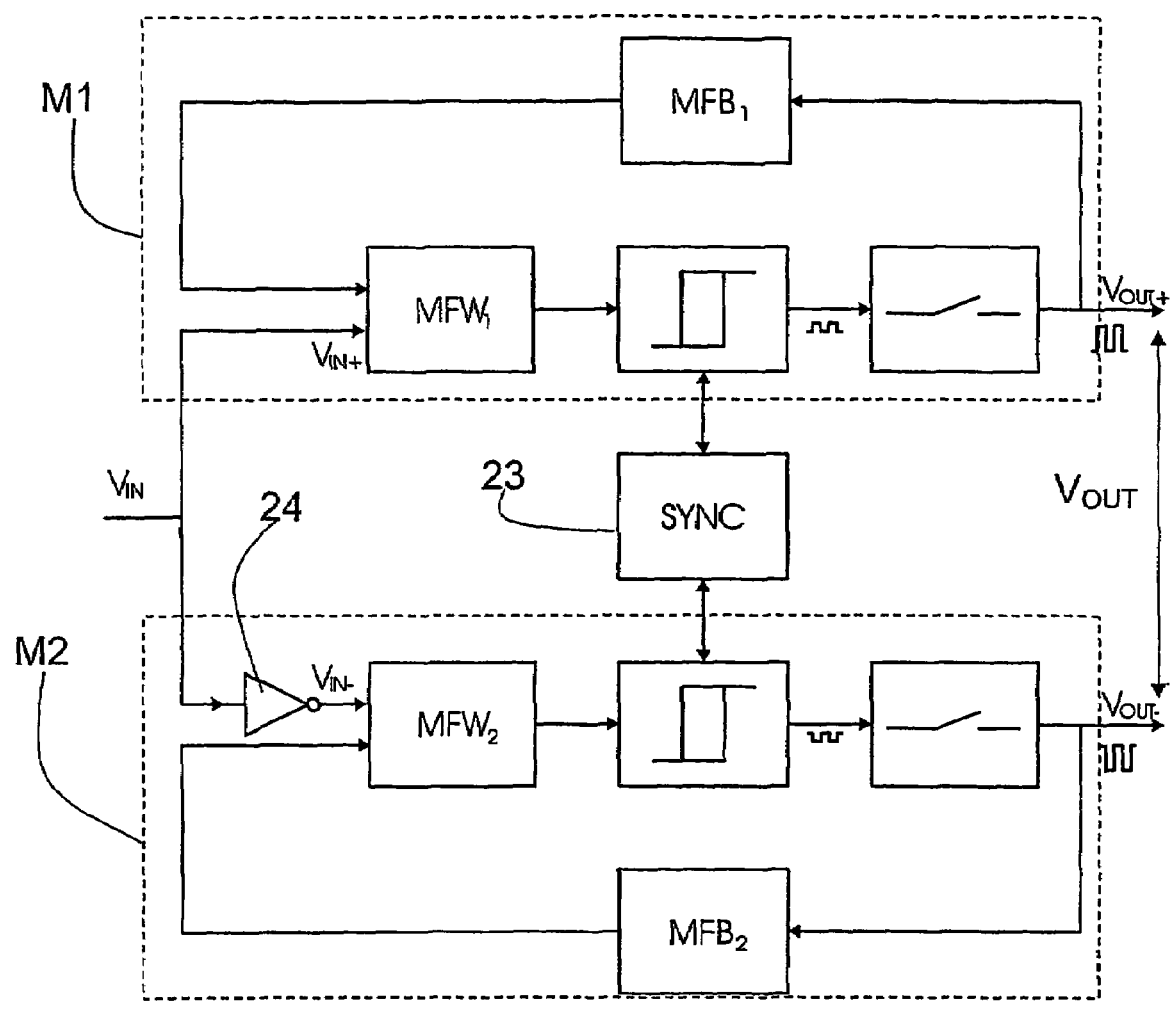
FIG. 24 shows how two modulators according to the invention can be used for generating three-level voltages.

Above a modulator according to the GLIM-principle has been described for a power amplifier/supply voltage employing two-level voltages, i.e. which either applies its total supply voltage or a zero voltage. However, a power supply or a power amplifier can also employ three-level voltages, where either a zero voltage or the positive or negative supply voltage, respectively, is applied onto the load. The latter can for instance be carried out by means of an H-bridge well-known to a person skilled in the art. For this purpose it is necessary to generate two control signals instead of one control signal unlike the above modulator, and these two control signals are generated by means of a modulator, cf. FIG. 24, which includes two modulators M1, M2 corresponding to the above GLIM-modulator. The same reference signal is applied onto both modulators M1, M2, but the signal for one modulator M1 is inverted by means of an inverter 24. The two modulators M1, M2 are usually identical. In principle, the two modulators M1, M2 can operate completely independently of one another as the power supply load of the power amplifier usually synchronizes the two modulators to a predetermined extent. In practice, it is often necessary to implement a synchronizing circuit between the two modulators, cf. the synchronizing block 23 in FIG. 24. As illustrated, the synchronizing block 23 is coupled between the Schmitt-triggers of the two modulators M1, M2, but they can just as well be coupled between other blocks of the modulators, such as for instance the output stage.

The Schmitt-trigger used in the above modulators is a component well-known to a person skilled in the art. The output of such a Schmitt-trigger alternates in response to the difference between the voltages applied onto its input. When one input exceeds the other input, the output is for instance the positive supply voltage; whereas when the second input exceeds the first input, then the output is zero or the negative supply voltage.

Figure 25:
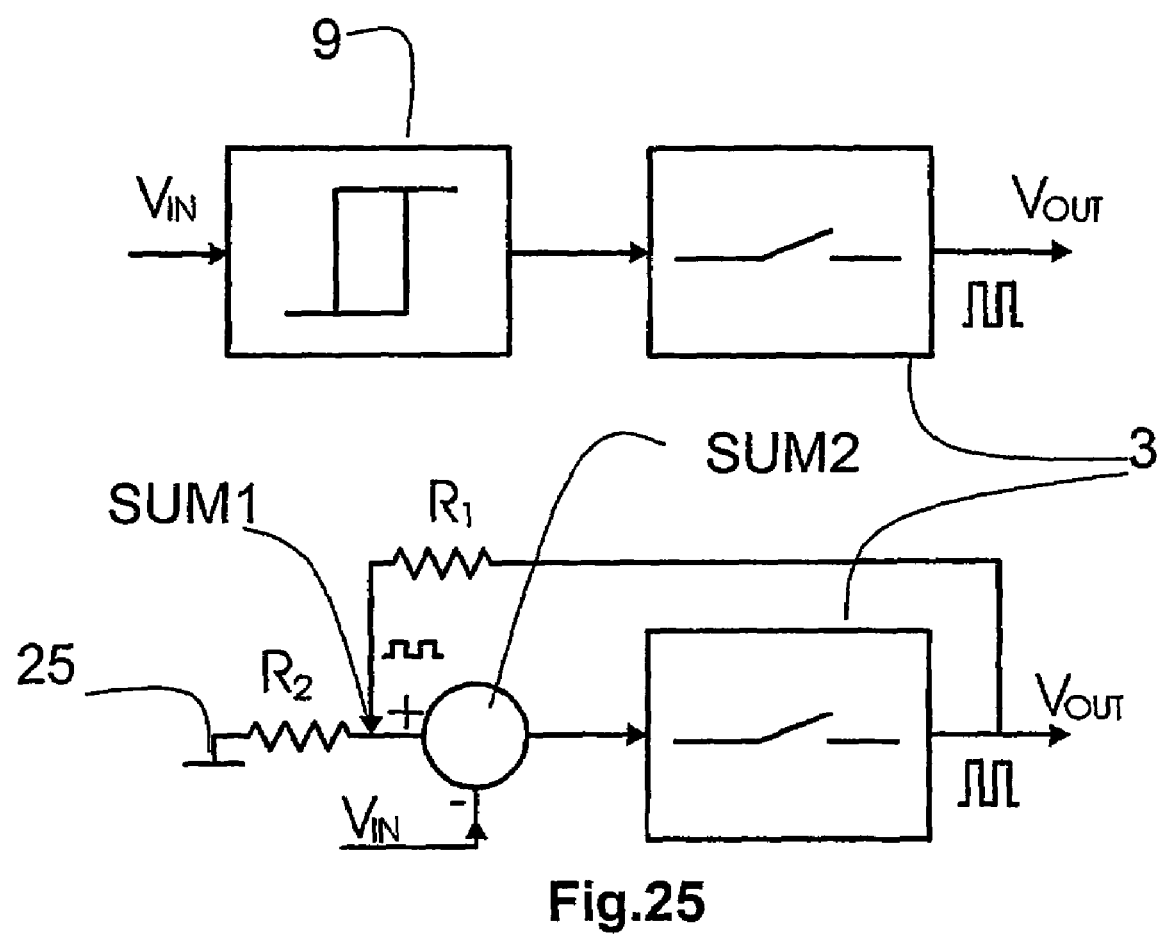
FIG. 25 shows a way of structuring a Schmitt-trigger.

In a modulator according to the invention, the Schmitt-trigger can advantageously be constructed as shown in FIG. 25. In such a Schmitt-trigger, the output voltage $V_{OUT}$ of the output stage is connected to a first resistance $R_1$ by means of a second resistance $R_2$ and further to the frame potential. The transition between the two resistances $R_1$, $R_2$ is connected to a summation point, where the second input for said summation point is the input voltage of the Schmitt-trigger, and where the output from said summation point is the input for the output stage. The hysteresis-window $V_{SCH}$ is determined as $V_{SUPPLY} \times R_2/(R_1+R_2)$, where $V_{SUPPLY}$ corresponds to the supply voltage for the output stage.

Figure 26:
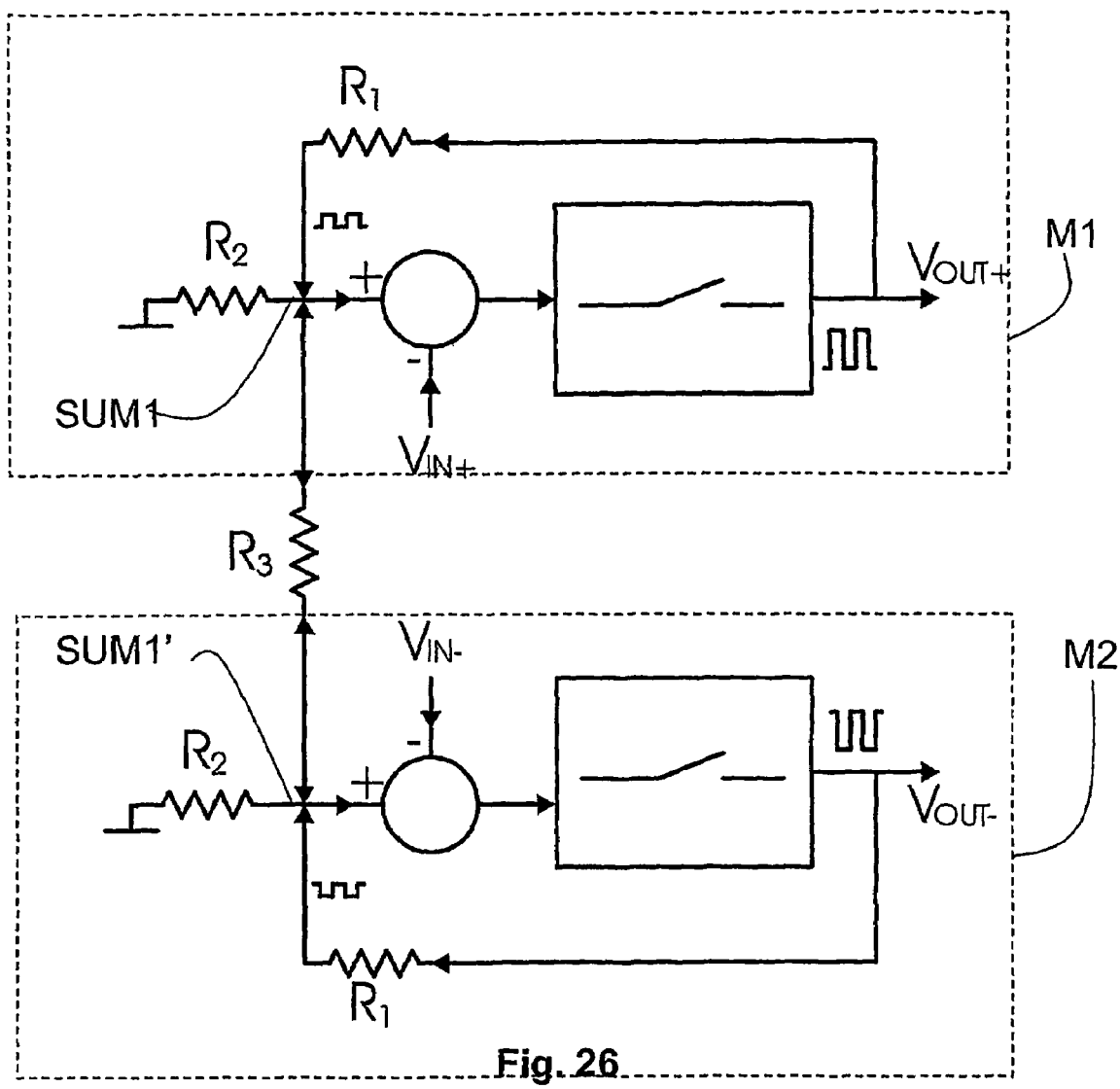
FIG. 26 shows how two Schmitt-triggers shown in FIG. 25 can be synchronized.

As mentioned above, the two modulators M1, M2 of FIG. 24 are synchronized, and here it is especially advantageous that the two Schmitt-triggers are the components to be synchronized. However, other components may be synchronized too. The synchronizing can be carried out in a simple way as shown in FIG. 26, where a resistance $R_3$ is coupled in the transition between the two resistances $R_1$, $R_2$ of the Schmitt-trigger of the first modulator M1 and in the transition between the two resistances $R_1$, $R_2$ of the Schmitt-trigger of the second modulator M2. The synchronizing is carried out by a minor portion of the hysteresis-window of one modulator is added to the hysteresis-window of the second modulator.

The invention has been described with reference to a preferred embodiment. However, the scope of the invention is not limited to the illustrated embodiment, and alterations and modifications can be carried out without deviating from said scope of the invention. The current measured through the output filter can for instance be used as feed-back signal instead of the output voltage. As a result, the power amplifier is operated by means of current instead of by means of voltage, whereby the advantage is obtained that it is not necessary to implement an overcurrent protection in the switch-mode power amplifier. The preferred embodiment employs an output filter in form of a second order filter, but other types of passive filters can be used as well.

The invention claimed is:

1. Switch-mode modulator operating at a two-level output voltage and including a forward loop and a feedback including a function block (14) with a transfer function (MFB), the forward loop including an alternating output stage (3), an optional output filter (5) and a forward block (12) having a transfer function (MFW) and being provided with means for calculating the difference between a feedback signal (14a) originating from said function block (14) and a reference signal (REF), where an output (13) of the forward block (12) is the input of a Schmitt-trigger (9), said Schmitt-trigger generating switch on signals (2) for switching the alternating output stage, characterized by the forward loop having an output voltage ($V_{out}$) being the output of the modulator and being fed back through the function block (14) so as to generate the signal (14a) fed back, and where the transfer function (MFB) of the function block (14) and the transfer function (MFW) of the forward block (12) is chosen based on the transfer function of the output filter (5) as well as on a desired total open-loop-transfer function of the modulator.

2. A switch-mode modulator according to claim 1, characterised in that one or more of the zeros or poles of the function block (14) and of the forward block (12) are chosen to be coinciding or approximately coinciding with the zero points of the output filter (5).

3. A switch-mode modulator according to claim 1, characterised by further including one or more additional output filters (15), one or more additional feedbacks with transfer functions (CFB$_N$) coupled either after the output stage (3), after the output filter (5) or after one or more of the additional output filters (15), as well as one or more forward blocks (17), which include both means for calculating the difference between one of the fed back signals from the additional function blocks (16) and a reference signal, as well as a transfer function (SFW$_N$).

4. A switch-mode modulator according to claim 3, characterised by the transfer function (MFB) 30 of the function block (14), the transfer function (MFW) of the forward block (12), the transfer functions (CFB$_N$) the additional output filters (15), the transfer functions (CFW$_N$) of the additional function blocks (16) and the additional forward blocks (17) together generating the desired total transfer function.

5. A switch-mode modulator according to claim 4, characterised by including only one additional function block (16) used as feedback for one or more additional forward blocks (17).

6. A switch-mode modulator according to claim 4, characterised by using the output signal (14a) of the function block (14) for feeding back to one or more additional forward blocks (17).

7. A switch-mode modulator according to claim 1, characterised by the desired total transfer function being 1st order low-pass-characteristic.

8. A switch-mode modulator according to claim 1, characterised by structuring the function block (14) of the feedback and the forward block (12) in such a manner that the output voltage is coupled either after the output stage (3) or after the output filter (5) to a summation point (SUM) through a first impedance, especially a 20 parallel coupling of a first resistance (K×R) and a capacitor (C), and further in such a manner that the reference (REF) is coupled to the summation point (SUM) through a second impedance, especially a second resistance (R), that the output voltage (V$_t$) of the summation point (SUM) is coupled to the input of the Schmitt-trigger (9).

9. A switch-mode modulator operating at three-level output voltages and including two switch-mode modulators as claimed in claim 1, characterised in that the modulator includes a first branch with a first switch-mode modulator operating at two-level-output voltages (M1) and a second branch with a second switch-mode modulator operating at two-level-output voltages (M2), where the input signal (V$_{IN}$) for 30 the first modulator (M1) and the input for the second modulator (M2) are mutually inverted, and that the voltage between the output (V$_{OUT}$+) of the first modulator (M1) and the output (V$_{OUT}$−) of the second modulator (M2) is the resulting output voltage (V$_O$UT).

10. A switch-mode modulator according to claim 9, characterised in that a synchronizing unit (23) is coupled between the first modulator (M1) and the second modulator (M2) and is adapted to synchronize the two modulators (M1, M2) to one another.

11. A switch-mode modulator according to claim 10, characterised in that the two Schmitt-triggers of the two modulators (M1, M2) are synchronized relative to one another.

12. A switch-mode modulator according to claim 1 characterised in, that the Schmitt-trigger (9) is constructed by the voltage after the output stage (3) or the voltage after the output filter (5) being fed back to a first summation point (SUM1) through a first resistance (R]) and further through a second resistance (R$_2$) to a frame reference (25), by the input voltage (V$_{IN}$) being deducted from the voltage from the first summation point (SUM1), and by the output voltage from the second summation point (SUM1) being the input of the output stage (3).

13. A switch-mode modulator according to claim 12, characterised in that the Schmitt-triggers of the two modulators (M1, M2) are synchronized by a resistance (R$_3$) being coupled between the first, summation point (SUM1) of the first modulator (M1) and the first, summation point (SUM1$^1$) of the second modulator (M2).

14. A switch-mode modulator according to claim 1, wherein the signal fed back is being compared to only one reference signal (REF).

15. A switch-mode modulator according to claim 7, wherein if the overall transfer function of the forward loop has a low-pass characteristic, the transfer function (MFW) of the feedback block (14) does not have a low-pass characteristic.

16. A switch-mode modulator according to one of the preceding claims, characterised by using a comparator instead of the used Schmitt-trigger, where the output signal of the comparator is time delayed by means of a time delay circuit.

* * * * *